United States Patent
Jung et al.

(10) Patent No.: US 7,199,669 B2
(45) Date of Patent: Apr. 3, 2007

(54) DUAL GATE CASCADE AMPLIFIER

(75) Inventors: Sung-jae Jung, Seoul (KR); Hoon-tae Kim, Yongin-si (KR); Yun-seong Eo, Suwon-si (KR); Kwang-du Lee, Suwon-si (KR); Sang-yoon Jeon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 53 days.

(21) Appl. No.: 10/956,082

(22) Filed: Oct. 4, 2004

(65) Prior Publication Data
US 2005/0073366 A1 Apr. 7, 2005

(30) Foreign Application Priority Data
Oct. 2, 2003 (KR) .................. 10-2003-0068610

(51) Int. Cl.
*H03F 3/04* (2006.01)
(52) U.S. Cl. ................. 330/311; 330/277; 330/310
(58) Field of Classification Search ............. 330/277, 330/311, 98, 310
See application file for complete search history.

(56) References Cited

U.S. PATENT DOCUMENTS

| 5,694,069 | A | * | 12/1997 | Kasashima et al. | 330/254 |
| 6,292,060 | B1 | | 9/2001 | Yeo et al. | 330/302 |
| 6,894,566 | B2 | * | 5/2005 | Claveau et al. | 330/286 |

FOREIGN PATENT DOCUMENTS

| KR | 0115030 | 1/1998 |
| KR | 10-0240421 | 1/2000 |

* cited by examiner

*Primary Examiner*—Khanh Van Nguyen
(74) *Attorney, Agent, or Firm*—Lee & Morse, P.C.

(57) ABSTRACT

A dual gate cascade amplifier includes a first transistor and a second transistor electrically connected in series, the second transistor including a first parallel transistor and a second parallel transistor, the first parallel transistor and the second parallel transistor being electrically connected in parallel, a first channel electrically connecting a first end channel region of the first transistor and a second end channel region, wherein one of the first or second end channel regions is a source and the other of the first or second end channel regions is a drain, the second end channel region being a common end channel region shared by the first and second parallel transistors, and a second channel electrically connected to the second end channel region and extending away from the first transistor.

18 Claims, 5 Drawing Sheets

DUAL GATE CASCADE AMPLIFIER

BACKGROUND OF THE INVENTION

1. Field of the Invention

The present invention relates to a dual gate cascade amplifier. More particularly, the present invention relates to a dual gate cascade amplifier having gates with adjustable widths.

2. Description of the Related Art

A conventional cascade amplifier has a structure in which a drain of a common source metal oxide semiconductor field effect transistor (MOSFET) is connected to a source of a common drain MOSFET. FIG. 1A illustrates a vertical cross-sectional view of a conventional cascade amplifier. FIG. 1B is an equivalent circuit diagram of the conventional cascade amplifier of FIG. 1A. Referring to FIGS. 1A and 1B, the conventional cascade amplifier includes two separate transistors, i.e., first and second transistors T1 and T2. The first and second transistors T1 and T2 have sources S1 and S2, respectively, drains D1 and D2, respectively, and gates G1 and G2, respectively. A channel C1 is disposed between the source S1 and drain D1 of the first transistor T1, and a channel C2 is disposed between the source S2 and drain D2 of the first transistor T2. Gate G1 is formed over the source S1, the channel C1, and the drain D1 of the first transistor T1 with a gate insulation layer (not shown) interposed therebetween. Gate G2 is formed over the source S2, the channel C2, and the drain D2 of the second transistor T2 with a gate insulation layer (not shown) interposed therebetween.

Gain of the conventional cascade amplifier can be controlled by controlling a voltage applied to the gate G2 of the second transistor T2. In addition, the conventional cascade amplifier has little gain loss but high circuit stability because it can reduce capacitance caused by Miller's effect and thus can prevent a feedback of an output signal. However, the conventional cascade amplifier may cause noise due to the resistance and parasitic capacitance of a substrate when using frequencies in a radio-frequency (RF) band. However, the characteristics of the conventional cascade RF amplifier may be adversely affected by substrate resistance and parasitic capacitance $R_{sub}$.

In a complementary metal oxide semiconductor (CMOS) structure, noise most typically occurs between the drain D1 of the first transistor T1 and the source S2 of the second transistor T2. In order to reduce noise, which is partly responsible for substrate loss in the CMOS structure, the substrate resistance may be increased, or portions of the CMOS structure, in which noise caused by the parasitic capacitance is likely to occur, (hereinafter, referred to as a noise source), may be removed. A dual gate transistor is one type of transistor, from which the noise region has been removed.

In the dual gate transistor, two gates share one channel disposed between a source and a drain. A dual gate transistor can be obtained by removing the drain D1 of the first transistor T1 and the source S2 of the second transistor T2 from the conventional cascade amplifier of FIG. 1.

FIG. 2A illustrates a vertical cross-sectional view of a conventional dual gate cascade amplifier, in which two gates share one channel. FIG. 2B is an equivalent circuit diagram of the dual gate cascade amplifier of FIG. 2A. Referring to FIGS. 2A and 2B, two gates G1 and G2 share one channel C between a source S1 and a drain D2.

The conventional dual gate cascade amplifier, unlike the conventional cascade amplifier of FIGS. 1A and 1B, in which the drain D1 of the first transistor T1 and the source S2 of the second transistor T2 serve as noise sources, does not have any noise sources and has a structure in which the two gates G1 and G2 share a common channel C. The conventional dual gate cascade amplifier can reduce a minimum noise figure $NF_{min}$ by about 0.7 dB. However, the conventional dual gate cascade amplifier has limited applicability.

FIG. 3 is a layout diagram of a conventional multi-finger dual gate cascade amplifier. Referring to FIG. 3, due to the structure of the conventional multi-finger dual gate cascade amplifier, transistors in the multi-finger dual gate cascade amplifier are necessarily formed to have the same total gate width. In order to optimize the noise and linearity characteristics of a cascade amplifier, it is necessary to adjust the total gate width of each transistor in the cascade amplifier. However, the noise and linearity characteristics of the conventional multi-finger dual gate cascade amplifier cannot be optimized because the total gate widths of the transistors in the conventional multi-finger dual gate cascade amplifier are not adjustable.

In addition, since the conventional multi-finger dual gate cascade amplifier, as shown in FIG. 3, does not have noise sources, such as the drain D1 of the first transistor T1 of FIG. 1 and the source S2 of the second transistor T2 of FIG. 1, a passive device for matching noise or power of one transistor with noise or power of another transistor, for example, an inductor, a capacitor, or a register, cannot be disposed between the transistors. Accordingly, even though the conventional multi-finger dual gate cascade amplifier can minimize noise caused by substrate resistance, it still has very limited applicability.

SUMMARY OF THE INVENTION

The present invention is therefore directed to a dual gate cascade amplifier, which substantially overcomes one or more of the problems due to the limitations and disadvantages of the related art.

It is a feature of an embodiment of the present invention to provide a dual gate cascade amplifier that is capable of adjusting total gate widths of transistors therein by allowing a common source transistor and a common gate transistor to have different total gate widths.

It is another feature of an embodiment of the present invention to provide a dual gate cascade amplifier that has wide applicability.

It is still another feature of an embodiment of the present invention to provide a dual gate cascade amplifier that is capable of reducing noise caused by substrate resistance in an RF-CMOS circuit.

It is yet another feature of an embodiment of the present invention to provide a dual gate cascade amplifier that is capable of optimizing noise, linearity, and/or output characteristics of a dual gate cascade amplifier.

At least one of the above features and other advantages may be provided by a dual gate cascade amplifier including a first transistor and a second transistor electrically connected in series, the second transistor including a first parallel transistor and a second parallel transistor, the first parallel transistor and the second parallel transistor being electrically connected in parallel, a first channel electrically connecting a first end channel region of the first transistor and a second end channel region, wherein one of the first and second end channel regions is a source and the other of the first and second end channel regions is a drain, the second end channel region being a common end channel region shared by the first and second parallel transistors, and a second channel electrically connected to the second end channel region and extending away from the first transistor.

The first transistor and the second transistor may have different total gate widths. The first transistor may be a common source transistor, the second transistor may be a common gate transistor and the common end channel region may be a drain. Alternatively, the first transistor may be a common gate transistor, the second transistor may be a common source transistor and the common end channel region may be a source.

The first and second channels may be arranged to extend straight with the second end channel region disposed therebetween.

The dual gate cascade amplifier may further include a conductive line electrically connecting the first channel, between a gate of the first transistor and a gate of the first parallel transistor, to the second channel, beyond a gate of the second parallel transistor. The conductive line may be a plurality of conductive lines electrically connected by a jumper line.

The dual gate cascade amplifier may further include a capacitor electrically connected between a gate of the first transistor and a gate of the first parallel transistor.

At least one of the above features and other advantages may be provided by a dual gate cascade amplifier including a first transistor, and a second transistor, the second transistor including two parallel transistors electrically connected in parallel, wherein each of the first and second transistors and the two parallel transistors is a multi-finger transistor.

In this dual gate cascade amplifier, one of the first transistor and the second transistor is a common source transistor and the other of the first transistor and the second transistor is a common gate transistor.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1A:
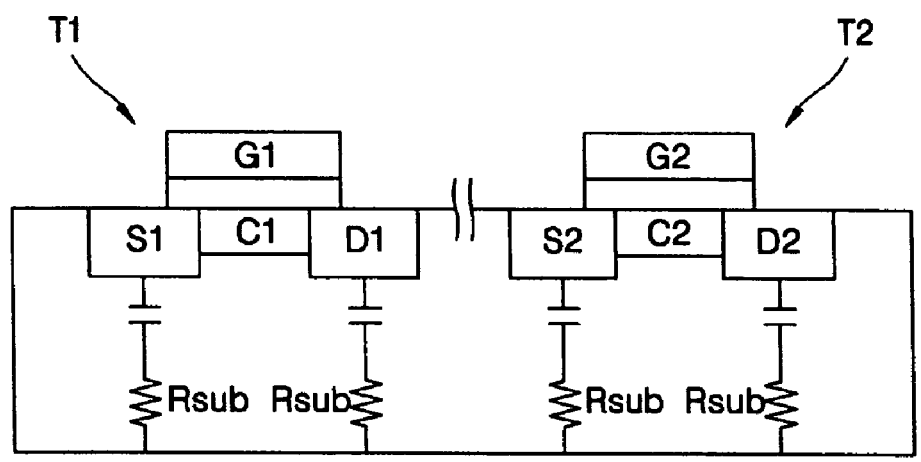
FIG. 1A illustrates a vertical cross-sectional view of a conventional cascade amplifier having two separate transistors.
Figure 1B:
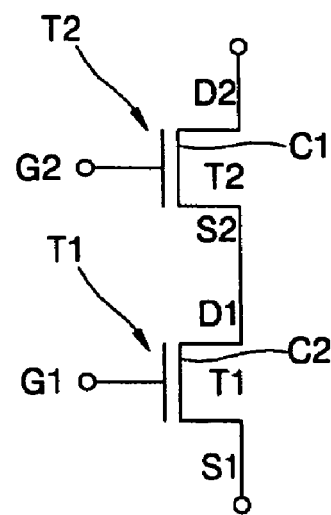
FIG. 1B is an equivalent circuit diagram of the conventional cascade amplifier of FIG. 1.
Figure 2A:
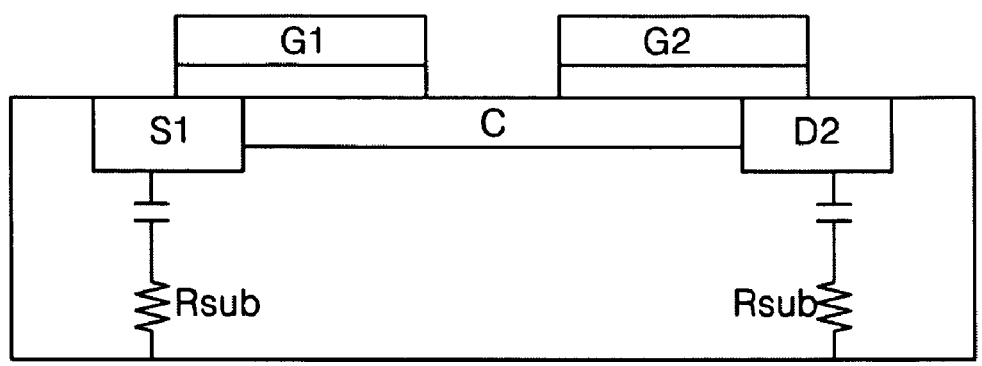
FIG. 2A illustrates a vertical cross-sectional view of a conventional dual gate cascade amplifier.
Figure 2B:
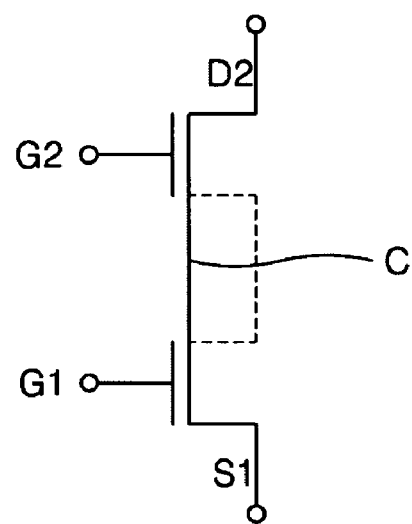
FIG. 2B is an equivalent circuit diagram of the conventional dual gate cascade amplifier.
Figure 3:
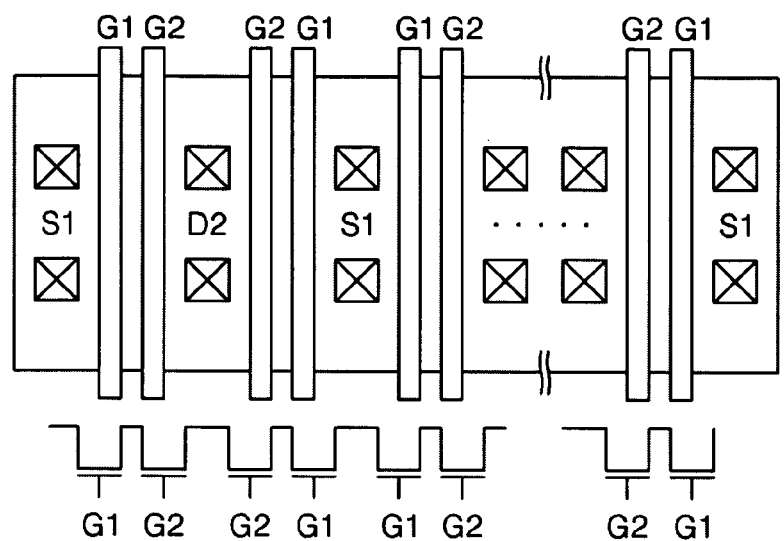
FIG. 3 is a layout diagram of a conventional multi-finger dual gate cascade amplifier.

Korean Patent Application No. 2003-68610, filed on Oct. 2, 2003, in the Korean Intellectual Property Office, and entitled: "Dual Gate Cascade Amplifier," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. Like reference numerals and characters refer to like elements throughout.

Figure 4A:
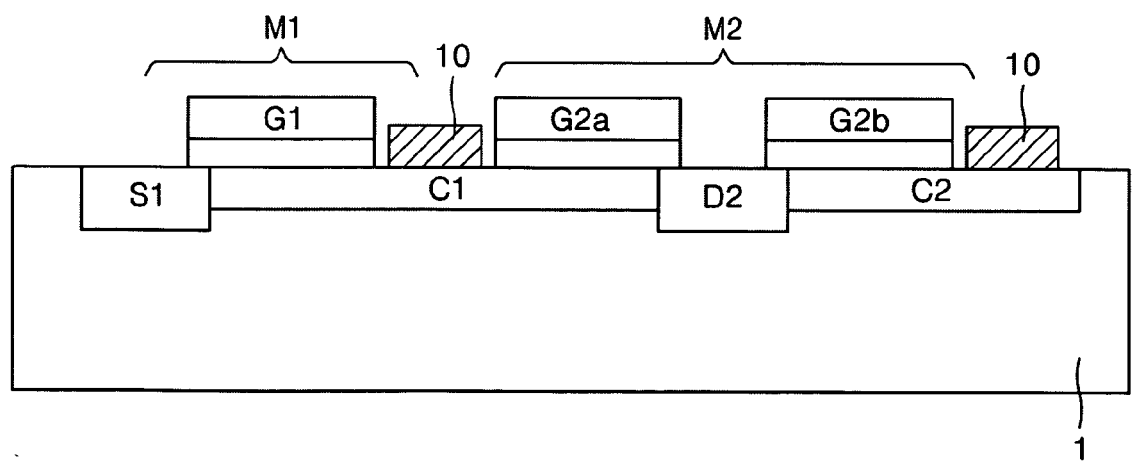
FIG. 4A illustrates a vertical cross-sectional view of an asymmetric dual gate cascade amplifier according to an exemplary embodiment of the present invention.
Figure 4B:
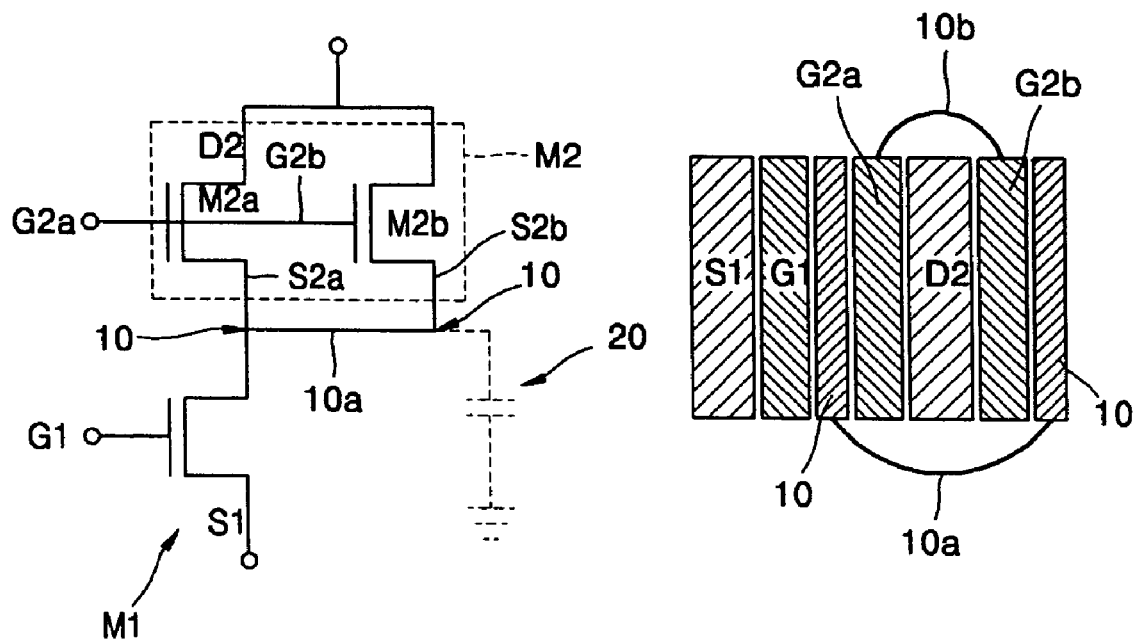
FIG. 4B is an equivalent circuit diagram of the asymmetric dual gate cascade amplifier of FIG. 4A.
Figure 4C:
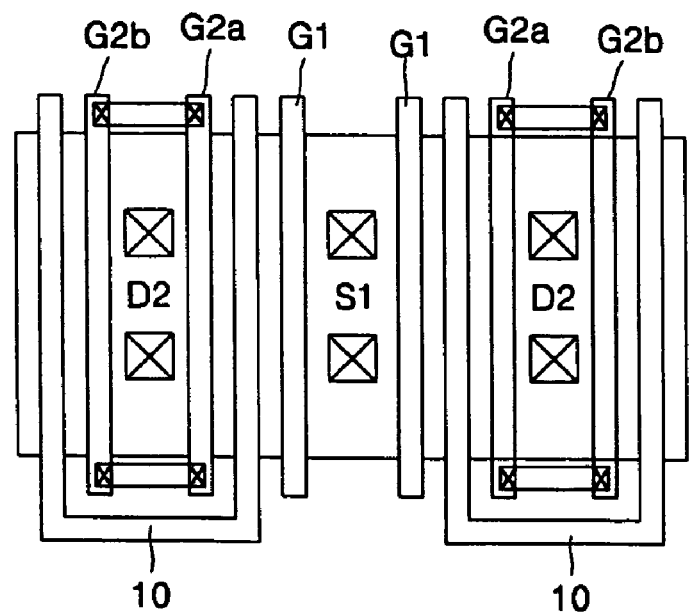
FIG. 4C is a layout diagram of the asymmetric dual gate cascade amplifier of FIG. 4A.

FIG. 4A illustrates a vertical cross-sectional view of an asymmetric dual gate cascade amplifier according to an exemplary embodiment of the present invention. FIG. 4B is an equivalent circuit diagram of the asymmetric dual gate cascade amplifier of FIG. 4A. FIG. 4C is a layout diagram of the asymmetric dual gate cascade amplifier of FIG. 4A.

Referring to FIGS. 4A through 4C, an asymmetric dual cascade amplifier according to an exemplary embodiment of the present invention includes a common source transistor M1 and a common gate transistor M2 formed on a substrate 1. The common gate transistor M2 includes two parallel transistors, i.e., first and second parallel transistors M2a and M2b.

The first and second parallel transistors M2a and M2b of the common gate transistor M2 have gates G2a and G2b, respectively, which are electrically connected to each other by jumper line 10b, and share a common drain D2. In addition, the first and second parallel transistors M2a and M2b are connected to a conductive line 10 so that sources S2a and S2b of the first and second parallel transistors M2a and M2b, respectively, can have the same electric potential. Here, it is assumed for the convenience of explanation that the sources S2a and S2b are not source regions obtained through an impurity doping process, but rather are portions of a channel, i.e., end channel regions.

A first conductive line 10 is disposed between a gate G1 of the common source transistor M1 and a gate G2a of the first parallel transistor M2a, and a second conductive line 10 is disposed at an end of a channel C2 of the second parallel transistor M2a. These two conductive lines 10 may be formed separate from each other and then electrically connected to each other via an additional jumper line 10a. Alternatively, these two conductive lines 10 may be integrated into a single conductive line.

In the present embodiment, the common source transistor M1 and the common gate transistor M2 may have different total gate widths. Thus, it is possible to optimize noise and linearity characteristics of the entire asymmetric dual gate cascade amplifier. In other words, it is possible to set an appropriate gate width for each of the common source transistor M1 and the common gate transistor M2 by allowing the common source transistor M1 and the common gate transistor M2 to have different gate widths.

In the present embodiment, a passive device for matching noise or output of the gate G1 with noise or output of the gate G2a, e.g., a capacitor 20, can be additionally disposed between the gates G1 and G2a due to the conductive line 10 disposed between the gates G1 and G2a.

In a typical CMOS operation, as frequency increases, the problem of substrate loss correspondingly increases. Therefore, the present embodiment of the present invention includes a dual gate cascade amplifier having the common source transistor M1 and the common gate transistor M2 in order to solve the problem of substrate loss. The common source transistor M1 has a significant influence on noise characteristics of the dual gate cascade amplifier, and the common gate transistor M2 has a significant influence on linearity characteristics of the dual gate cascade amplifier. The noise and linearity characteristics of the dual gate cascade amplifier can be optimized by allowing the common source transistor M1 and the common gate transistor M2 to have different total gate widths.

In the embodiment shown in FIGS. 4A–4C, the common gate transistor M2 includes the two parallel transistors. In an alternative embodiment, a common source transistor M1', instead of a common gate transistor M2', may include the two parallel transistors. This alternative embodiment of the present invention will now be described in connection with FIGS. 5A and 5B.

Figure 5A:
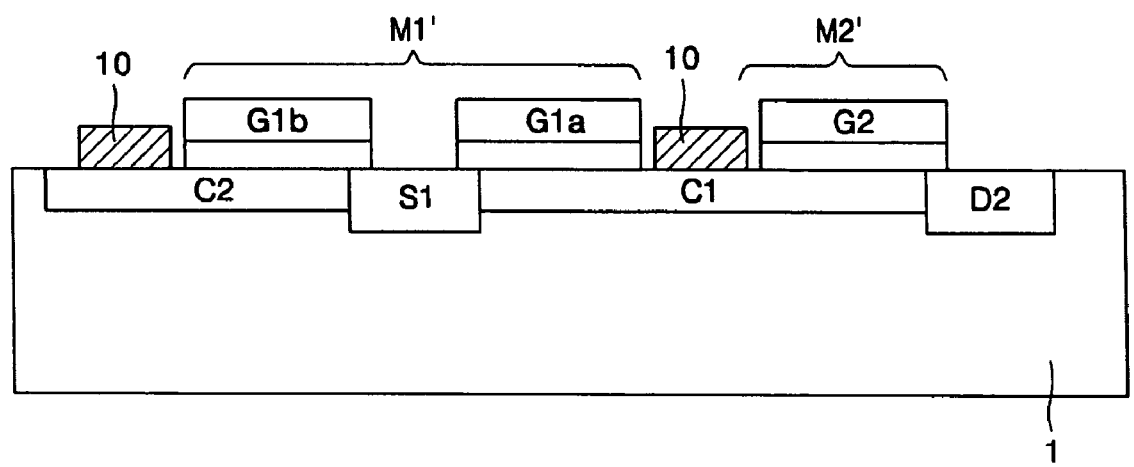
FIG. 5A illustrates a vertical cross-sectional view of an asymmetric dual gate cascade amplifier according to another exemplary embodiment of the present invention.
Figure 5B:
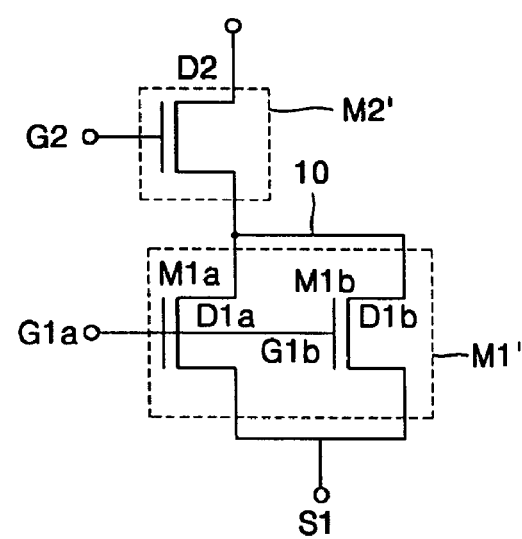
FIG. 5B is an equivalent circuit diagram of the asymmetric dual gate cascade amplifier of FIG. 5A.

FIG. 5A illustrates a vertical cross-sectional view of an asymmetric dual gate cascade amplifier according to another exemplary embodiment of the present invention. FIG. 5B is an equivalent circuit diagram of the asymmetric dual gate cascade amplifier of FIG. 5A.

Referring to FIGS. 5A and 5B, the asymmetric dual gate cascade amplifier according to this exemplary embodiment of the present invention includes a common source transistor M1' including two parallel transistors, i.e., first and second parallel transistors M1a and M1b, and a common gate transistor M2'.

The first and second parallel transistors M1a and M1b of the common source transistor M1' have gates G1a and G1b, respectively, and share a common source S1. Drains D1a and D1b of the first and second parallel transistors M1a and M1b, respectively, are connected to a conductive line 10 so that they can have the same electric potential. Here, it is assumed for the convenience of explanation that the drains D1a and D1b are not drain regions obtained through an impurity doping process, but rather are portions of a channel, i.e., end channel regions.

A first conductive line 10 is disposed between the gate G1a of the first parallel transistor M1a and a gate G2 of the common gate transistor M2', and a second conductive line 10 is disposed at an end of a channel C2 of the second parallel transistor M1b. As described above in connection with the previous embodiment, these two conductive lines 10 may be formed separate from each other and then electrically connected to each other via an additional jumper line. Alternatively, these two conductive lines 10 may be integrated into a single conductive line.

As described above, according to the present invention, it is possible to reduce noise caused by substrate resistance in an RF-CMOS circuit and optimize noise, linearity, or output characteristics of a dual gate cascade amplifier by allowing a common source transistor and a common gate transistor to have different total gate widths.

The present invention can be applied to various types of amplifiers, e.g., RF amplifiers. More generally, the present invention can be applied to any type of amplifier that has a dual gate transistor structure and would benefit from a gate width of the dual gate transistor structure to be adjustable.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A dual gate cascade amplifier, comprising:
    a first transistor and a second transistor electrically connected in series, the second transistor including a first parallel transistor and a second parallel transistor, the first parallel transistor and the second parallel transistor being electrically connected in parallel;
    a first channel electrically connecting a first end channel region of the first transistor and a second end channel region, wherein one of the first and second end channel regions is a source and the other of the first and second end channel regions is a drain, the second end channel region being a common end channel region shared by the first and second parallel transistors; and
    a second channel electrically connected to the second end channel region and extending away from the first transistor.

2. The dual gate cascade amplifier as claimed in claim 1, wherein the first transistor and the second transistor have different total gate widths.

3. The dual gate cascade amplifier as claimed in claim 1, wherein the first transistor is a common source transistor, the second transistor is a common gate transistor and the common end channel region is a drain.

4. The dual gate cascade amplifier as claimed in claim 1, wherein the first transistor is a common gate transistor, the second transistor is a common source transistor and the common end channel region is a source.

5. The dual gate cascade amplifier as claimed in claim 1, wherein the first and second channels are arranged to extend straight withthe second end channel region disposed therebetween.

6. The dual gate cascade amplifier as claimed in claim 1, further comprising a conductive line electrically connecting the first channel, between a gate of the first transistor and a gate of the first parallel transistor, to the second channel, beyond a gate of the second parallel transistor.

7. The dual gate cascade amplifier as claimed in claim 6, wherein the conductive line is a plurality of conductive lines electrically connected by a jumper line.

8. The dual gate cascade amplifier as claimed in claim 1, further comprising a capacitor electrically connected between a gate of the first transistor and a gate of the first parallel transistor.

9. A cascade amplifier, comprising:
    a first transistor formed on a substrate, the first transistor including a first source/drain region in the substrate and a first gate that at least partially overlaps a first common channel region in the substrate;
    a second transistor including a first parallel transistor and a second parallel transistor, the first parallel transistor and the second parallel transistor being electrically connected in parallel, the first parallel transistor including a second gate that at least partially overlaps the first common channel region and a common drain/source region, the second parallel transistor including a third gate, the second parallel transistor sharing the common drain/source region with the first parallel transistor and at least partially overlapping a second channel region in the substrate;
    wherein the first common channel region extends between the first source/drain region and the common drain/ source region and one end of the second channel region extends from the common drain/source region.

10. The cascade amplifier as claimed in clam 9, further comprising a conductive line overlapping a portion of the first common channel and a portion of the second channel such that the first common channel is electrically connected to the second channel.

11. The cascade amplifier as claimed in claim 10, wherein a first portion of the conductive line overlapping the first common channel is arranged on the substrate between the first gate and the second gate and a second portion of the conductive line overlapping the second channel is arranged on the substrate adjacent to the third gate.

12. The cascade amplifier as claimed in claim 11, wherein a space exists between the conductive line and each of the first gate, the second gate and the third gate.

13. The cascade amplifier as claimed in claim 12, wherein a first side of the third gate faces a first side of the second gate and the second conductive portion extends along a second side of the third gate that is opposite to the first side of the third gate.

14. The cascade amplifier as claimed in claim 10, wherein the first portion and the second portion of the conductive line are connected via a jumper line.

15. The cascade amplifier as claimed in claim 9, wherein the first gate and the second gate are connected via a jumper line.

16. The cascade amplifier as claimed in claim 9, wherein:
when the first source/drain region is a source region, the common drain/source region is a drain region, and
when the first source/drain region is the drain region, the common drain/source region is the source region.

17. A cascade amplifier, comprising:
a common source transistor; and
a common gate transistor, the common gate transistor sharing a first common channel region with the common source transistor, wherein,
one of the common source transistor and the common gate transistor includes a first parallel transistor and a second parallel transistor, the first parallel transistor and the second parallel transistor being electrically connected in parallel,
one of the first parallel transistor and the second parallel transistor shares the first common channel region and the other of the first parallel transistor and the second parallel transistor is associated with a second channel region,
the first common channel region continuously extends between a first source/drain region and a common drain/source region, and
one end of the second channel region is connected to the common drain/source region.

18. The cascade amplifier as claimed in claim 17, further comprising a conductive line overlapping a portion of the first common channel region and a portion of the second channel region and electrically connecting the first common channel region to the second channel region.

* * * * *